(12) United States Patent
McElvain

(10) Patent No.: US 6,449,762 B1
(45) Date of Patent: Sep. 10, 2002

(54) MAINTAINING CORRESPONDENCE BETWEEN TEXT AND SCHEMATIC REPRESENTATIONS OF CIRCUIT ELEMENTS IN CIRCUIT SYNTHESIS

(75) Inventor: Kenneth S. McElvain, Los Altos, CA (US)

(73) Assignee: Synplicity, Inc., Sunnyvale, CA (US)

( * ) Notice: Subject to any disclaimer, the term of this patent is extended or adjusted under 35 U.S.C. 154(b) by 0 days.

(21) Appl. No.: 09/414,993

(22) Filed: Oct. 7, 1999

(51) Int. Cl.[7] .............................................. G06F 17/50
(52) U.S. Cl. ....................................................... 716/18
(58) Field of Search ................................. 716/2, 4, 18

(56) References Cited

U.S. PATENT DOCUMENTS 5,555,201 A * 9/1996 Dangelo ........................ 716/2

* cited by examiner

Primary Examiner—Matthew Smith
Assistant Examiner—Thuan Do
(74) Attorney, Agent, or Firm—Blakely, Sokoloff, Taylor & Zafman LLP

(57) ABSTRACT

A method and apparatus that maintains the correspondence between a text representation of a circuit element and the corresponding schematic representation of the element after optimization of the circuit containing the element. In one example of a method of the invention, a circuit containing element is described in text representation. A first tag is assigned to the text representation. The text representation is synthesized to produce a first schematic representation of the circuit element. A second tag corresponding to the first tag is assigned to the first schematic representation of the circuit element. The circuit containing the circuit element is optimized to produce a second schematic representation of the circuit element. A third tag corresponding to the first tag is assigned to the second schematic representation. Other methods and apparatuses are described.

31 Claims, 9 Drawing Sheets

| TEXT EXPRESSION<br>HDL Source Code | SCHEMATIC OBJECT<br>RTL Netlist | OPTIMIZED<br>SCHEMATIC OBJECT<br>RTL Netlist |
|---|---|---|
| Case 1 | Gate 1 | Gate 1' |
| . . . | . . . | . . . |
| if X = 1, then . . . | Gate 2 + Gate 3 | Gate 2' + Gate 3' |
| . . . | . . . | . . . |

FIG. 4 (Prior Art)

| TEXT EXPRESSION<br>HDL Source Code | SCHEMATIC OBJECT<br>RTL Netlist | OPTIMIZED<br>SCHEMATIC OBJECT<br>RTL Netlist |
|---|---|---|
| Case 1 <Tag 1> | Gate 1 <Tag 1> | Gate 1' <Tag 1> |
| . . . | . . . | . . . |
| if X = 1, then . . . | Gate 1 <Tag 2A><br>Gate 2 <Tag 2B> | Gate 1' <Tag 2A><br>Gate 2' <Tag 2B> |
| . . . | . . . | . . . |

MAINTAINING CORRESPONDENCE BETWEEN TEXT AND SCHEMATIC REPRESENTATIONS OF CIRCUIT ELEMENTS IN CIRCUIT SYNTHESIS

FIELD OF THE INVENTION

The present invention relates generally to the field of circuit design synthesis, and more particularly to circuit design synthesis through hardware description language.

BACKGROUND OF THE INVENTION

For the design of digital circuits on the scale of VLSI (Very Large Scale Integration) technology, designers often employ computer-aided techniques. Standard languages known as Hardware Description Languages (HDL's) have been developed to describe digital circuits to aid in the design and simulation of complex digital circuits. Several hardware description languages, such as VHDL and Verilog, have evolved as industry standards. VHDL and Verilog are general purpose hardware description languages that allow definition of a hardware model at the gate level, the register transfer level (RTL), or the behavioral level using abstract data types. As device technology continues to advance, various product design tools have been developed to adapt HDLs for use with newer devices and design styles.

In designing circuits using HDL compilers, designers first describe circuit elements in HDL source code and then compile the source code to produce synthesized RTL netlists. The RTL netlists correspond to schematic representations of the circuit elements. The circuits containing the synthesized circuit elements are often optimized to improve timing relationships and eliminate unnecessary or redundant logic elements. Such optimization typically involves substituting different gate types or combining and eliminating gates in the circuit, and often results in re-ordering the hierarchies and relationships between the original RTL objects and the underlying source code that produced the RTL objects.

Typical present circuit synthesis systems do not maintain correspondence between HDL source code expressions and the corresponding RTL objects after optimization of the circuit containing the RTL objects. These present systems thus do not allow identification or display of HDL source code corresponding to certain optimized circuit elements. Such loss of correspondence limits modification or debugging of circuit elements since the corresponding source code cannot be readily located.

SUMMARY OF THE INVENTION

The present invention discloses methods and apparatuses that maintain the correspondence between a text representation of a circuit element or elements and the corresponding schematic representation of the element(s) after synthesis and optimization of the circuit containing the element(s).

In one example of a method of the invention, a circuit element is described in text representation in a source code file. A first tag is assigned to the text representation. The text representation is synthesized to produce a first schematic representation of the circuit element. A second tag corresponding to the first tag is assigned to the first schematic representation of the circuit element. The circuit containing the circuit element is optimized to produce a second schematic representation of the circuit element. A third tag corresponding to the first tag is assigned to the second schematic representation.

In one particular example of a method of the invention, a text representation, such as HDL source code, of a logic circuit is displayed. Then a graphical representation (e.g. a logical gate level schematic diagram) is displayed after compiling the text representation (resulting in a first logical gate level schematic). Then this compiled, synthesized design may be optimized resulting in a second logical gate level schematic which may be displayed. A user may select a portion of the text representation prior to optimization to cause a display of a corresponding portion of the first logical gate level schematic, and after optimization, the user may select the portion of the text representation to cause a display of a corresponding portion of the second logical gate level schematic, which may differ from the first logical gate level schematic. The corresponding portions of the first and second gate level schematics may be different due to the optimization of the synthesized logic. In each case, the corresponding portions of the gate level schematic resulted from the compilation of text representation. The association between text representation and the resulting gate level schematic is maintained (preserved) through optimizations. Similarly, a user may, prior to optimization, select a portion of the first logical gate level schematic to cause a display of a corresponding portion of the text representation (which was compiled to create the selected portion of the first logical gate level schematic). After optimization, the user may select a portion of the second logical gate level schematic (which may be different from the selected portion of the first logical gate level schematic), and this selection causes the display of a corresponding portion of the text representation (which was compiled to produce a result which, after optimization, produced the selected portion of the second gate level schematic) or a display of a portion of the first logical schematic.

According to another aspect of the present invention, the logical gate level schematic may be filtered to display only some of the gates in the design, whether or not these gates are in a critical path in the circuit.

The present invention provides computer systems which are capable of performing methods of the invention, and the invention also provides computer readable material which, when executed on a digital processing system, such as a computer system, causes the system to execute one or more of the methods of the invention.

Other features of the present invention will be apparent from the accompanying drawings and from the detailed description which follows.

BRIEF DESCRIPTION OF THE DRAWINGS

The present invention is illustrated by way of example and not limitation in the figures of the accompanying drawings, in which like references indicate similar elements, and in which:

FIG. 4 is a table that illustrates the correspondence among an original source code text expression, a corresponding RTL netlist representation, and the resulting RTL netlist representation after optimization.

FIG. 6 is a table that illustrates the assignment and maintenance of tags for an original source code text expression, a corresponding RTL netlist representation, and the resulting RTL netlist representation after optimization, according to one embodiment of the present invention.

DETAILED DESCRIPTION

A system for maintaining correspondence between text and graphical representation of circuit elements during circuit synthesis and optimization is described. In the following description, for purposes of explanation, numerous specific details are set forth in order to provide a thorough understanding of the present invention. It will be evident, however, to one skilled in the art that the present invention may be practiced without these specific details. In other instances, well-known structures and devices are shown in block diagram form to facilitate explanation.

It is an intended advantage of certain embodiments of the present invention to provide a system which preserves the correlation between the text description and a resulting synthesized and optimized circuit.

It is a further intended advantage of certain embodiments of the present invention to provide a system that graphically displays circuit elements corresponding to selected source code descriptions of the elements and vice versa (selected graphic elements cause the display of corresponding source code after optimization).

Hardware Overview

Figure 1:
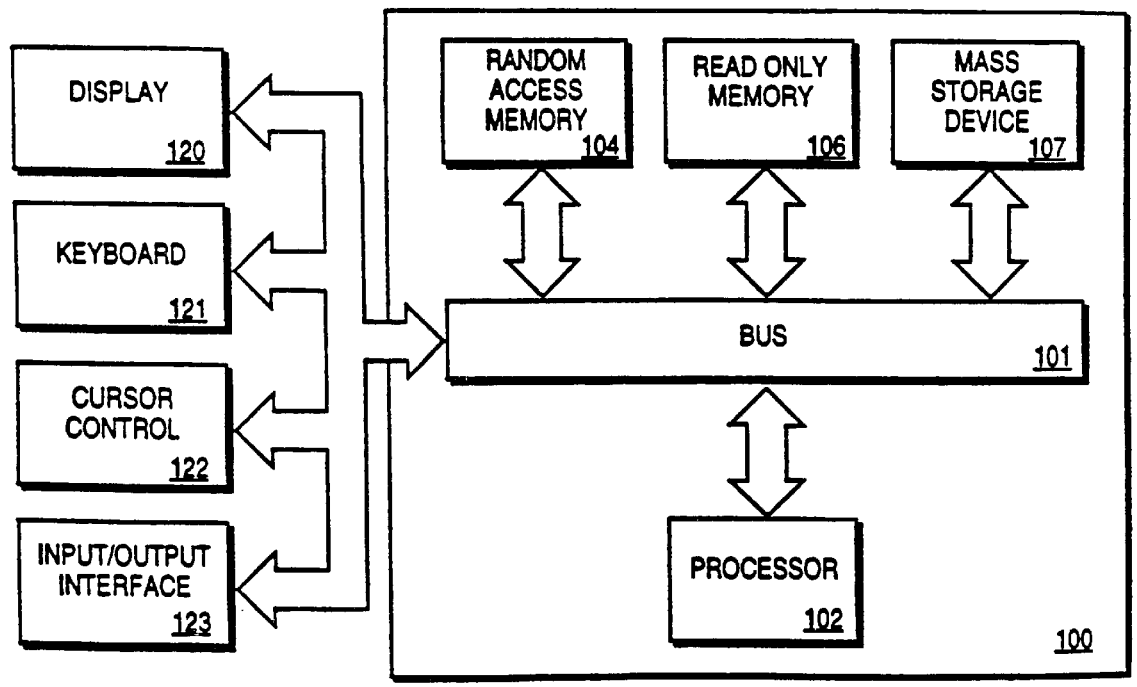
FIG. 1 is a block diagram of a computer system that may be used to implement an embodiment of the present invention.

FIG. 1 illustrates a block diagram of a computer system that may be used to implement an embodiment of the present invention. The computer system is used to perform logic synthesis of a design that is described in an HDL. The computer system 100 includes a processor 102 coupled through a bus 101 to a random access memory (RAM) 104, a read only memory (ROM) 106, and a mass storage device 107. Mass storage device 107 represents a persistent data storage device, such as a floppy disk drive, fixed disk drive (e.g., magnetic, optical, magneto-optical, or the like), or streaming tape drive. Processor 102 may be embodied in a general purpose processor (such as the Intel® Pentium™ processor), a special purpose processor, or a specifically programmed logic device.

Display device 120 is coupled to processor 102 through bus 101 and provides graphical output for computer system 100. Keyboard 121 and cursor control unit 122 are coupled to bus 101 for communicating information and command selections to processor 102. Also coupled to processor 102 through bus 101 is an input/output (I/O) interface 123 which can be used to control and transfer data to electronic devices (printers, other computers, etc.) connected to computer 100.

It should be noted that the architecture of FIG. 1 is provided only for purposes of illustration, and that a computer used in conjunction with the present invention is not limited to this specific architecture.

Circuit Synthesis

A method of one embodiment of the present invention preserves the correlation between a source code description of a circuit element and its corresponding schematic representation after optimization of the circuit for a target architecture. An embodiment of the present invention is intended for use with hardware description language (HDL) design synthesis software, although the invention is not limited to such use. Although use with other languages and computer programs is possible, embodiments of the present invention will be described in the context of use in HDL synthesis systems. In order to provide a context for a description of embodiments of the present invention, an example of a logic synthesis process from HDL source code will be described.

Figure 2:
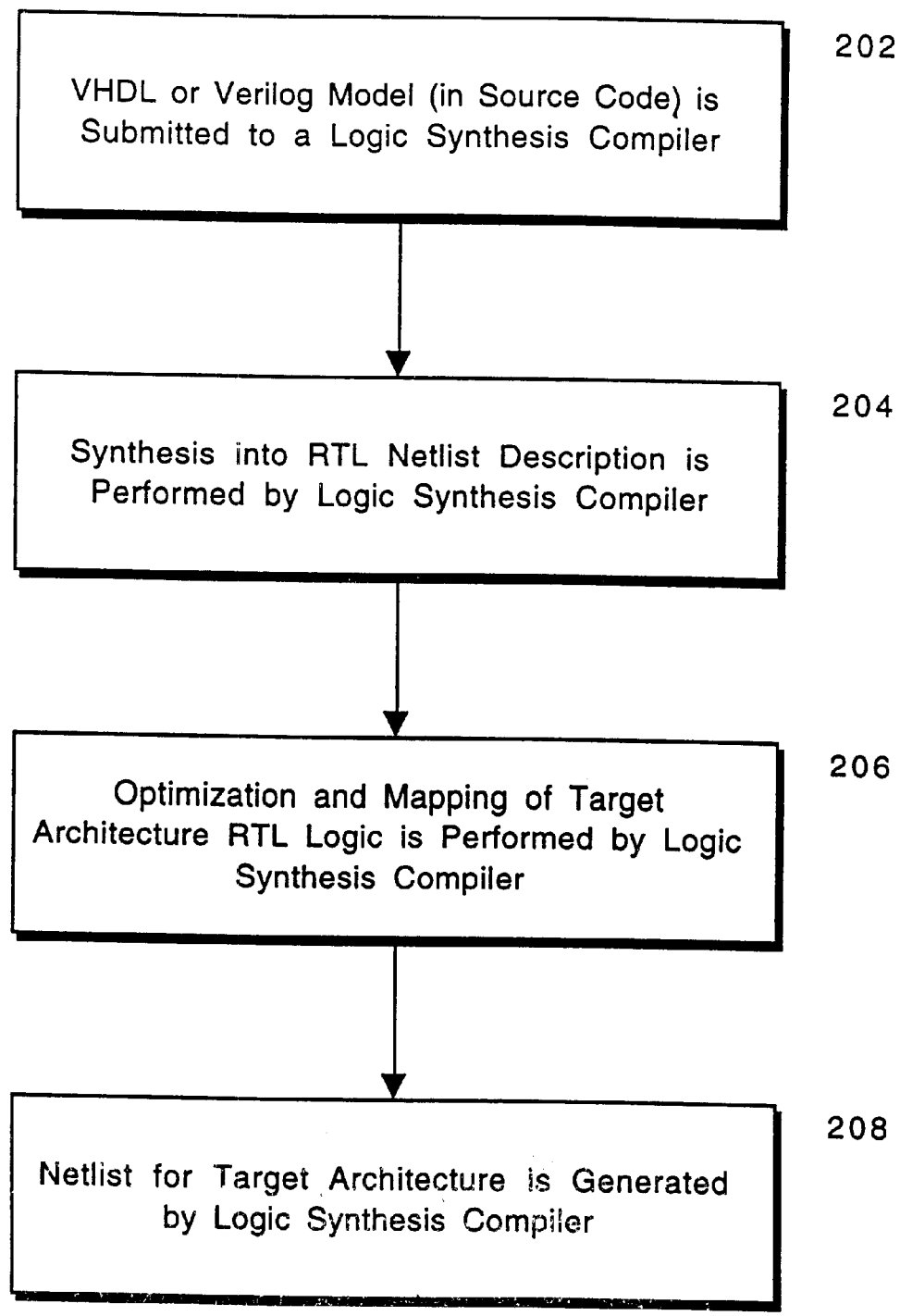
FIG. 2 is a flowchart illustrating the steps of an HDL synthesis process that is used with an embodiment of the present invention.

FIG. 2 is a flowchart illustrating the steps of an HDL synthesis process that is used with an embodiment of the present invention. FIG. 2 shows an example of an electronic design automation process that uses logic synthesis from an HDL description of a circuit to generate a detailed, gate level description that is used to create the circuit in a semiconductor integrated circuit (IC). The following description assumes that the IC will be fabricated using a library of building blocks (e.g., lookup tables, multiplexers, I/O flip-flops, and so on) that is used by a particular target architecture. However, it will be appreciated that certain embodiments of the present invention may be used in design processes which are not confined to using a particular library with a confined set of building blocks. That is, the present invention may be used with circuit design which is technology independent.

The process of FIG. 2 begins with the authoring of HDL source code that describes the circuit to be implemented. The authoring process involves writing HDL source code descriptions of the elements of the circuit, and is well described in the literature. See, for example, Verilog HDL: A Guide to Digital Design and Synthesis, Samir Palnithar, SunSoft Press, 1996; also see, A VHDL Synthesis Primer, J. Bhasher, Star Galaxy Publishing, 1996.

A completed version of the authored source code is then submitted to a logic synthesis compiler, step 202. This logic synthesis compiler is typically a computer program that operates on a general purpose computer system, although in some embodiments, the computer system may be a dedicated, special purpose computer system. An example of a logic synthesis compiler is the program "Synplify™" from Synplicity, Inc. of Sunnyvale, Calif. The submitted HDL code is then compiled, in operation 204, into a particular level of description which is often an RTL (register transfer level) netlist. The RTL netlist will usually show registers and other logic interconnected to show the flow of data through a circuit that was described in the HDL code. In other examples of logic synthesis, the compiler may produce a gate level description of the circuit.

In operation 206, the logic synthesis compiler optimizes and maps the synthesized RTL netlist description from operation 204 into a target architecture. The target architecture is typically determined by a supplier of programmable IC's. An example of a target architecture is the programmed lookup tables (LUTs) and associated logic of the Xilinx XC4000 integrated circuit which is a field programmable gate array from Xilinx, Inc. of San Jose, Calif. Other examples of target architectures include those well known architectures in field programmable gate arrays and complex programmable logic devices from vendors such as Altera, Lucent Technologies, Advanced Micro Devices (AMD), and Lattice Semiconductor. The present invention may also be employed with ASICs (Application Specific Integrated Circuits). The mapping operation in operation 206 converts the synthesized RTL level description of the desired circuit into the equivalent circuit implemented using building blocks of the target architecture. The optimization operation in operation 206 optimizes the desired circuit, as implemented using those building blocks, by removing unnecessary logic circuits and other circuit elements.

Typically, the next operation, operation 208, of the process involves generating a netlist that serves as an input to the target architecture's place and route software tools (which is usually provided by the vendor which specifies the target architecture); these tools use the netlist to automatically specify the inputs to the vendor's IC in order to program the IC to produce the desired circuit. In one embodiment of the present invention, however, operation 208 may generate a gate level netlist for a particular target architecture by performing the operations of the vendor's place and route software tools. It will also be appreciated that, if no particular target architecture is specified (e.g., the designed circuit is to be technology independent), then operations 206 and 208 will usually produce a circuit schematic and associated netlist which may be used to construct an IC.

Digital circuits designed for use in VLSI devices contain upwards of hundreds of thousands of transistors which make up various different circuits such as logic gates, counters, arithmetic units, and so on. The use of an optimizer in the design of programmable logic devices using circuit synthesis tools is critical in reducing unnecessary circuitry and meeting circuit timing needs. Because circuit optimization typically involves reorganization of circuit elements, or even the removal of certain circuit elements, optimization processes typically result in the breakdown of circuit element hierarchies present in the original HDL or other programming source code used to define the circuit.

Figure 3A:
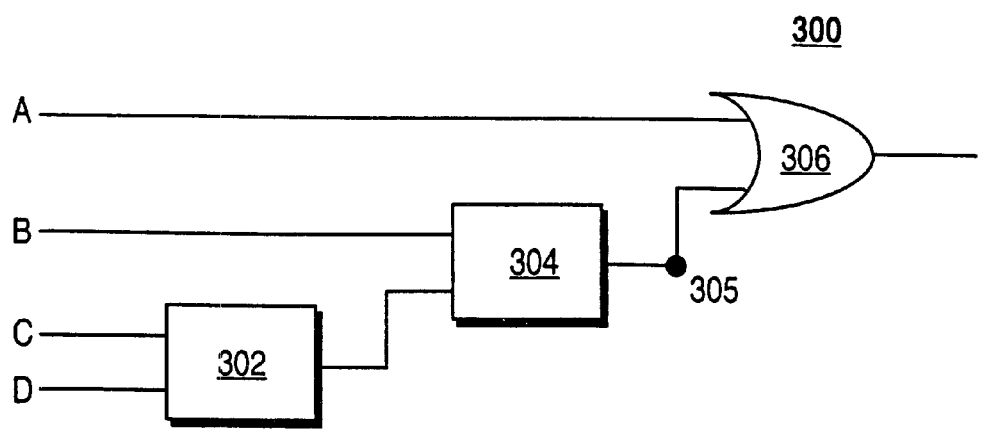
FIG. 3A is a block diagram of a simple example of a circuit design and intended logic output.
Figure 3B:
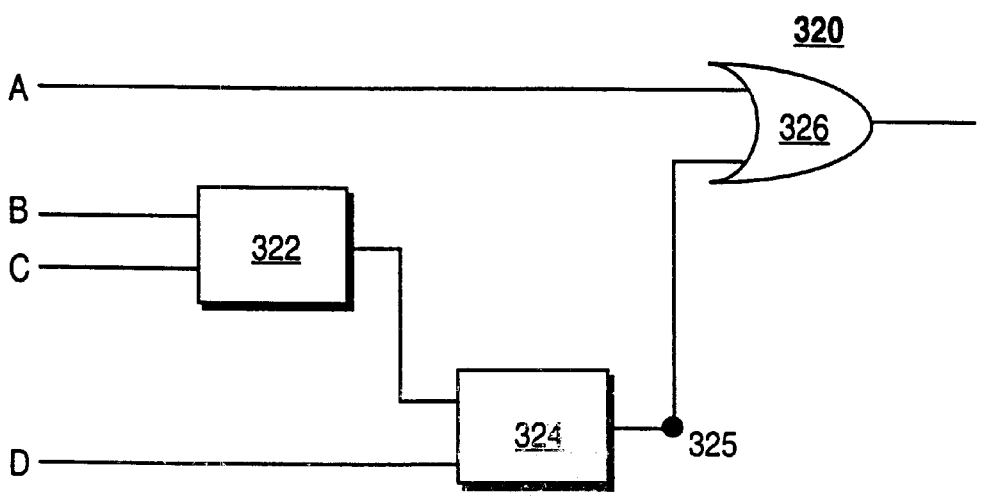
FIG. 3B illustrates an example of the circuit of FIG. 3A after an optimization operation.

FIGS. 3A and 3B illustrate a simple example of the optimization of a circuit that results in a reorganization of circuit elements and their respective hierarchical relationships. FIG. 3A is a block diagram of a simple example of a circuit design and intended logic output. In FIG. 3A, gate 302 receives inputs C and D, and gate 304 receives the output of gate 302 and input B. The output of gate 304 and input A are inputted into OR-gate 306. The logic output at node 305, corresponding to the output of gate 304, is defined as the product of inputs B, C, and D. Thus, the logic state at node 305 is defined by the function, F=BCD.

According to the process illustrated in the flowchart of FIG. 2, circuit 300 is first defined in HDL source code for input to a logic synthesis program. Each gate in circuit 300 may be defined in a line of HDL source code in terms of its inputs and outputs and timing constraints. A logic synthesis compiler then produces an RTL netlist description of the circuit. Prior to mapping the RTL netlist to a target device, the RTL logic is optimized. Depending on the type of logic gates and circuit timing requirements, the original circuit may be transformed somewhat prior to final netlist generation.

FIG. 3B illustrates an example of the circuit of FIG. 3A after an optimization operation. In circuit 320 of FIG. 3B, gate 322 receives inputs B and C, and gate 324 receives the output of gate 322 and input D. The output of gate 344 and input A are input into OR-gate 326. The logic output at node 325, corresponding to the output of gate 324, is defined as the product of inputs B, C, and D. Thus, the logic state at node 305 is defined by the function, F =BCD. The logic relationship between the original circuit 300 and its optimized counterpart, circuit 320, has been maintained, insofar as the inputs to the final OR-gate consist of input A and the function BCD. However, the gates through which inputs B, C, and D are processed have been transformed from the original circuit design. Such transformation may have been necessary to preserve particular timing requirements or to eliminate unnecessary circuits or redundancy present in the original circuit design.

FIG. 4 is a table that illustrates the correspondence among an original source code text expression, a corresponding RTL netlist representation, and the resulting RTL netlist representation after optimization. In Table 400 the text expression "Case 1" is represented as a schematic object in RTL netlist form as Gate 1. After optimization the corresponding RTL netlist for Case 1 becomes Gate 1'. Depending on the result of the optimization process, Gate 1 may be identical to Gate 1, or it may be a different type of gate or a portion of a different logic circuit. Likewise, the logic relationship defined in HDL code as "if X=1, then . . . " is implemented as combinational logic and defined in an RTL netlist representation as Gate 2 and Gate 3. After optimization the RTL netlist for this logic relationship is represented as Gate 2' and Gate 3'. Again, depending on the optimization process, Gate 2' and Gate 3' may not correspond to the originally derived Gate 2 and Gate 3.

In typical present logic synthesis programs, correspondence between a schematic netlist representation of a circuit element and the original HDL source code representation of the element is not maintained after optimization if the element has been transformed during the optimization process. Thus, with reference to FIG. 4, correspondence between Case 1 in the source code and Gate 1 is lost after Gate 1 is optimized to produce Gate 1' in the logical gate schematic.

In one embodiment of the present invention, the correspondence between the schematic netlist representation of a circuit element and the original source code description of the element is preserved after the circuit has been optimized. In this case, using the example provided above, correspondence between Case 1 and Gate 1 is preserved after Gate 1 is optimized to produce Gate 1'.

Figure 5:
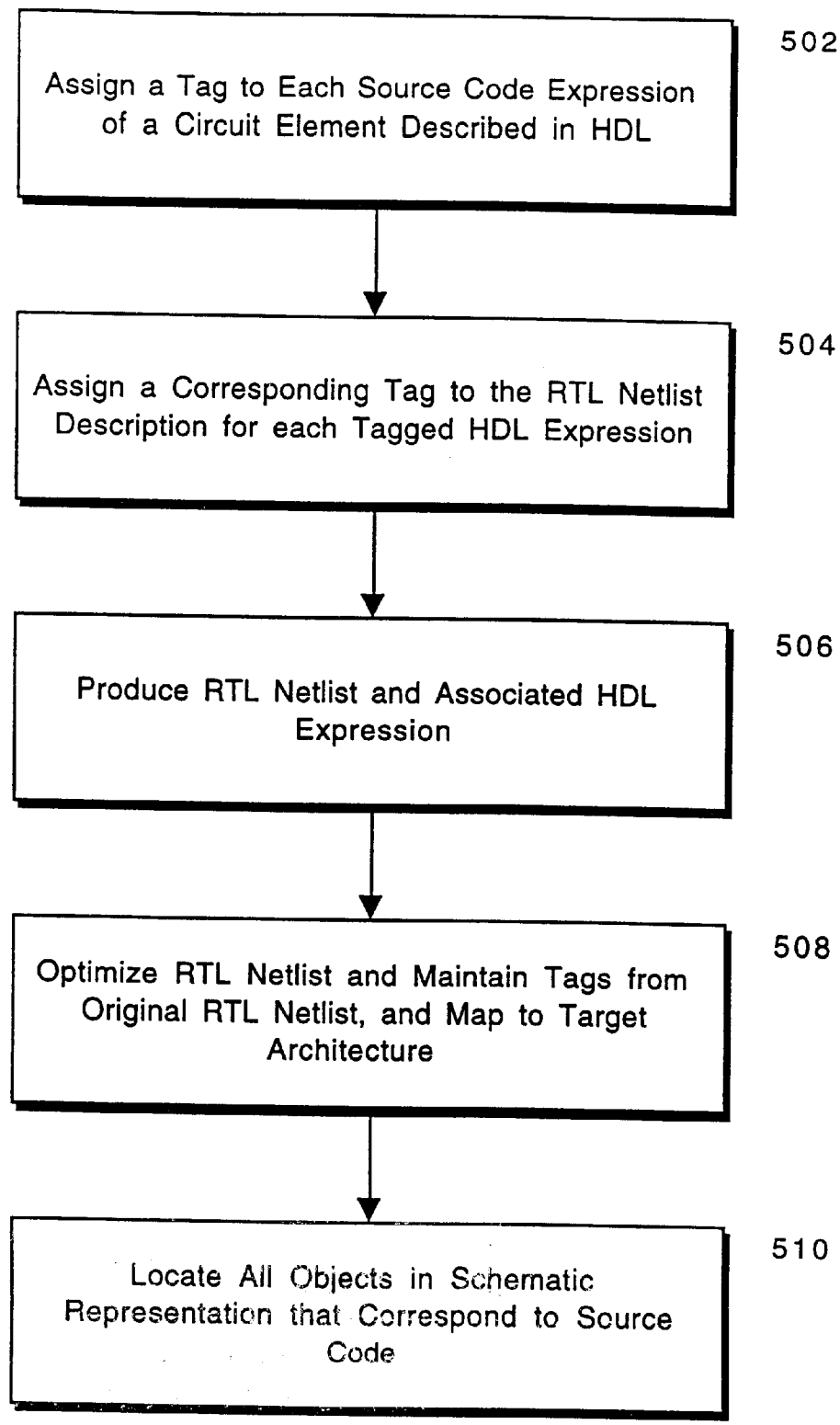
FIG. 5 is a flowchart that illustrates a method of maintaining source code and schematic object representation after optimization, according to one embodiment of the present invention.

FIG. 5 is a flowchart that illustrates a method of maintaining source code and schematic object representation after optimization, according to one embodiment of the present invention. It will be appreciated that the method of FIG. 5 is used in conjunction with a process of logic synthesis, such as the process shown in FIG. 2.

As stated above, with regard to FIG. 2, the circuit to be implemented is first described in HDL source code using HDL authoring tools. During the authoring process, a tag is assigned to each HDL expression that represents a circuit element (e.g., a register, port, or any other relevant element), operation 502. A tag may be a name or a source location or a position on a schematic or netlist or any property associated with where an object came from. In operation 504, after a synthesis operation, a corresponding tag is assigned to each RTL netlist representation of a tagged HDL expression. In this manner, the assigned tags are maintained between original source code expressions and the synthesized schematic representations through the synthesis process. In operation 506, the primary RTL netlists and the associated HDL expressions that produced the netlists are generated.

The RTL logic is then optimized and mapped to the target architecture in operation 508. During the optimization operation, the tags assigned to the RTL netlists are maintained such that corresponding tags are assigned to the optimized elements. In operation 510, the schematic representations of the elements corresponding to the original HDL expressions are located. The corresponding circuit structures for the optimized and mapped elements are then generated and displayed on a display device.

In one embodiment of the present invention, the logic synthesis compiler implements a parser that tracks the assigned tags between synthesis from HDL source code to the RTL netlist representation, and then between original RTL netlist representation and optimized RTL netlist representation. The tracking or transfer of assigned tags (e.g. from original RTL netlist to optimized RTL netlist) may be accomplished by preserving the tags onto gates (and tracking the gates with their tags) or by performing Boolean matching as described below.

FIG. 6 is a table that illustrates the assignment and maintenance of tags for an original source code text expression, a corresponding RTL netlist representation, and the resulting RTL netlist representation after optimization, according to one embodiment of the present invention. In Table 600 the text expression "Case 1" is assigned Tag 1. The corresponding schematic object for this expression is Gate 1, which is also assigned Tag 1 after synthesis from the HDL text. After optimization the corresponding RTL netlist for Case 1 becomes Gate 1'. Gate 1' is also assigned Tag 1. Thus, even if Gate 1' is not identical to Gate 1, their respective Tags are identical and both correspond to the original HDL expression Tag. In this manner the identity of the source code that produced the ultimate optimized circuit element is maintained. This allows a user to display the original source code and select a portion of that source code to cause a display of the corresponding portion of the logical gate schematic after optimization. Thus, the selected portion of source code may be highlighted on a display device and the corresponding portion also highlighted. Similarly, the user may select a portion of the displayed logical gate schematic which has been optimized and cause the display of a corresponding portion of the original source code from which this selected portion was derived.

As further illustrated in FIG. 6, the expression "if X=1, then . . . " is assigned Tag 2. During synthesis, the compiler generates Gates 2 and 3, which are assigned Tags 2A and 2B, respectively. After optimization the RTL netlist for this logic relationship is represented as Gate 2' and Gate 3'. Again, depending on the optimization process, Gates 2' and 3' may not correspond to the originally derived Gates 2 3, however, both Gates 2' and 3' are assigned the same Tags, 2A and 2B.

Figure 7:
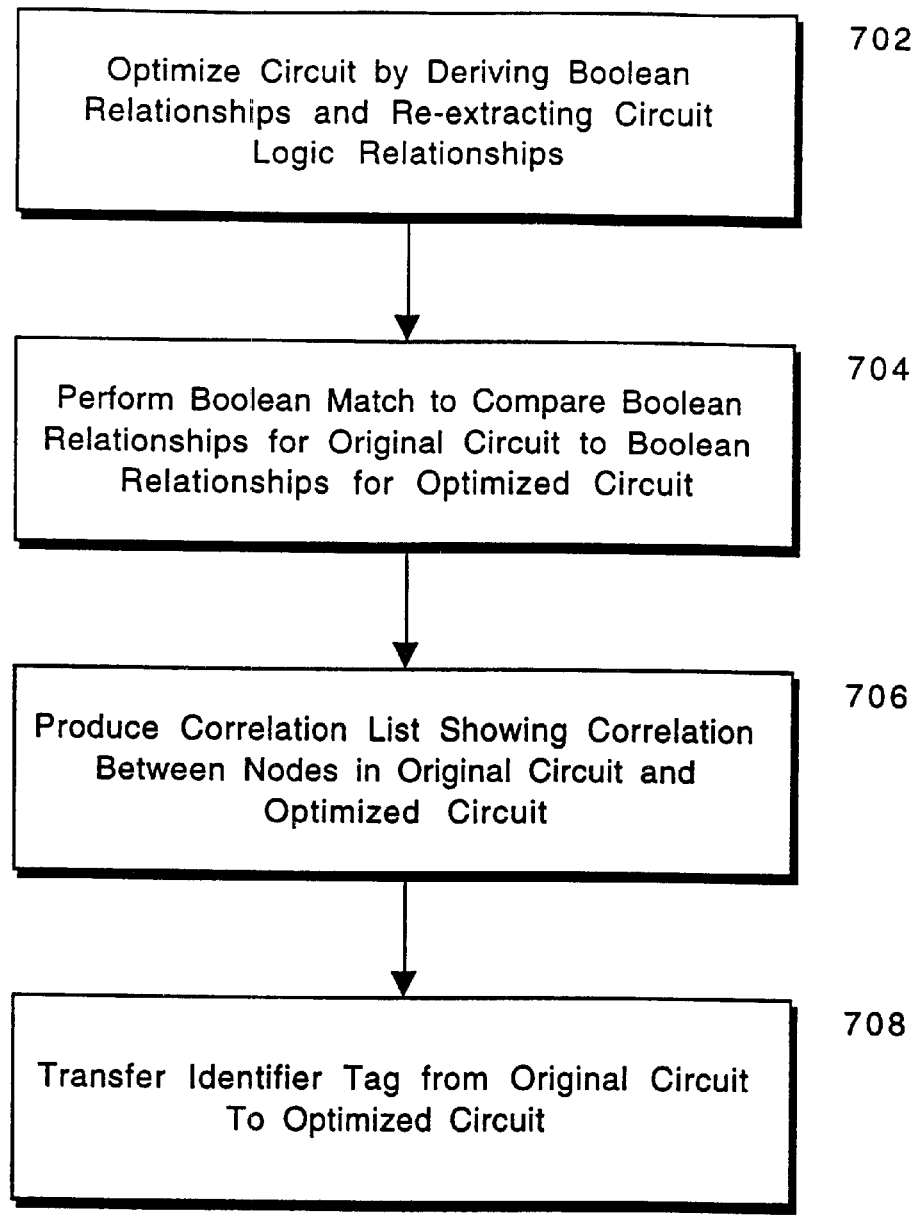
FIG. 7 is a flowchart that illustrates the steps of correlating logic relationships between an original and optimized circuit using Boolean matching, according to one embodiment of the present invention.

In one embodiment of the present invention, a Boolean match operation is performed to correlate the logic relationships between an original circuit and its optimized counterpart. FIG. 7 is a flowchart that illustrates the steps of correlating logic relationships between an original and optimized circuit using Boolean matching, according to one embodiment of the present invention.

It is to be noted that the process illustrated in FIG. 7 is performed in the process of a comprehensive circuit synthesis operation, such as illustrated in FIGS. 2 and 5. In one embodiment of the present invention, the operations of FIG. 7 are executed as sub-operations within operations 206 and 208 of FIG. 2. In an alternative embodiment of the present invention, the operations of FIG. 7 are executed as sub-operations within operations 508 and 510 of FIG. 5.

The correlation process illustrated in FIG. 7 starts with operation 702 in which an original circuit is optimized.

Boolean relationships among the elements in the original circuit are derived. These Boolean relationships are optimized and resulting circuit logic is re-extracted from the optimized Boolean code to produce an optimized circuit. In operation 704, a Boolean match is performed to compare the Boolean relationships between the original circuit and the optimized circuit. A correlation list showing the correlation between nodes of the original circuit and optimized circuit is then generated, operation 706. Identifier tags assigned to circuit elements in the original circuit are transferred to the optimized circuit in operation 708.

Figure 8A:
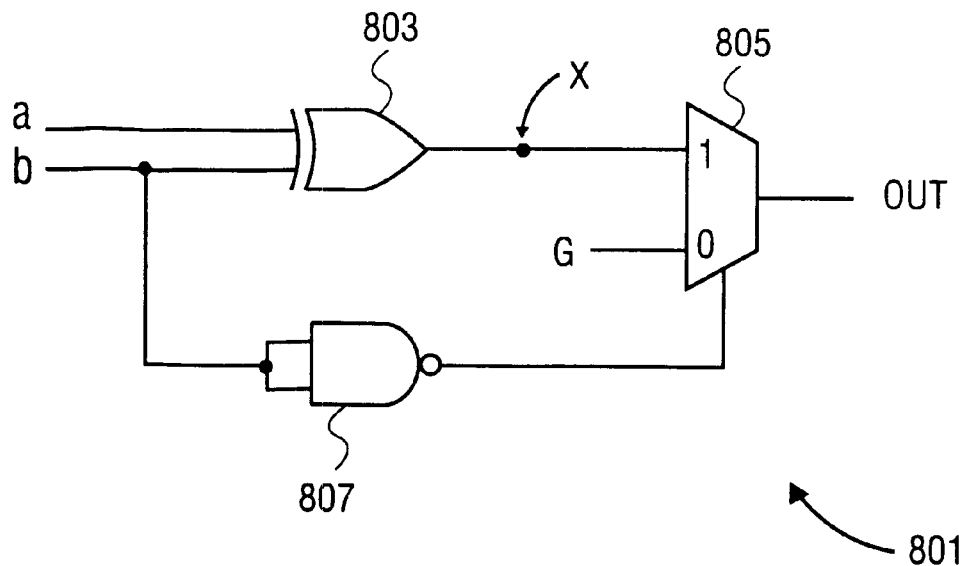
FIGS. 8A and 8B respectively show an example of a schematic representation of logic before and after optimization.
Figure 8B:
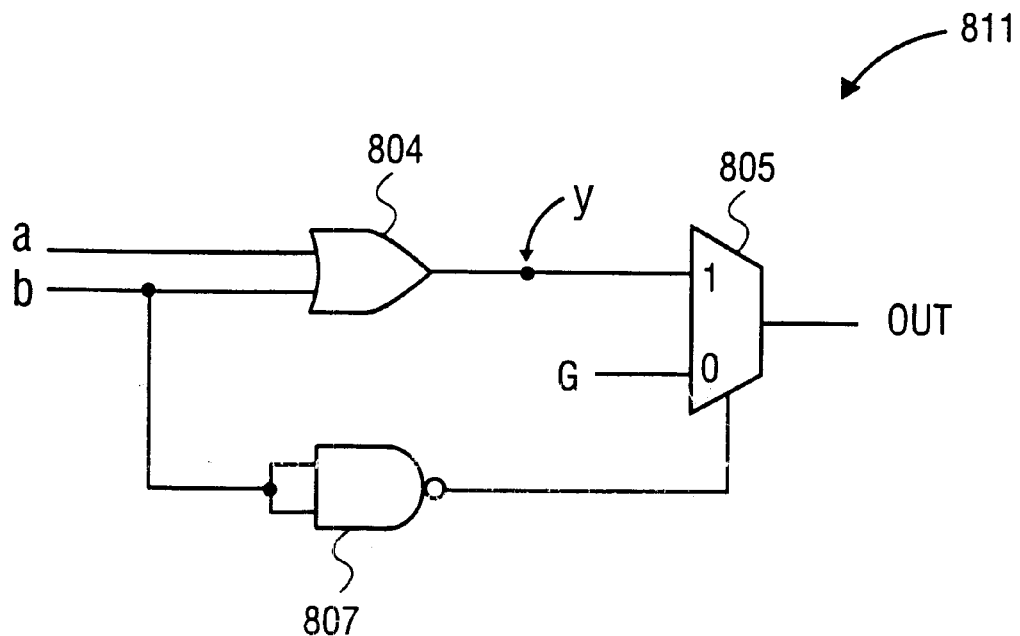

FIGS. 8A and 8B respectively show an example of Boolean matching to compare the Boolean relationships between an original circuit and an optimized circuit. FIG. 8A may be assumed to be an original circuit 801 having node x and inputs a and b and an output "OUT." The circuit 801 includes XOR 803, multiplexer 805 and NAND 807 interconnected as shown in FIG. 8A. FIG. 8B shows an optimized circuit 811 which may be assumed to be an optimized version of circuit 801. The circuit 811 includes OR gate 804, multiplexer 805, and NAND 807. Effectively, the optimization process changed the XOR gate 803 into the OR gate 804, causing node x to now be a different node "y." The nodes are different because given a combination of inputs, the nodes do not always produce the same values, as shown in the accompanying tables.

TABLE A

|  | a | b | x | Select Line | OUT |
| --- | --- | --- | --- | --- | --- |
| Row 1 | 0 | 0 | 0 | 1 | 0 |
| Row 2 | 1 | 0 | 1 | 1 | 1 |
| Row 3 | 0 | 1 | 1 | 0 | G |
| Row 4 | 1 | 1 | 0 | 0 | G |

TABLE B

|  | a | b | y | Select Line | OUT |
| --- | --- | --- | --- | --- | --- |
| Row 1 | 0 | 0 | 0 | 1 | 0 |
| Row 2 | 1 | 0 | 1 | 1 | 1 |
| Row 3 | 0 | 1 | 1 | 0 | G |
| Row 4 | 1 | 1 | 1 | 0 | G |

Single preservation of assigned tags from the original circuit to the optimized circuit may suggest that nodes x and y may be treated as being correlated (and hence the same tag is used). Simple Boolean matching, however, may not produce the same result. However, Boolean matching may include an inversion, and Boolean matching may be extended to include correlations when nodes are different only when not observable. That is, when nodes are the same except when not observable, then they may be treated as correlated, and FIGS. 8A and 8B show this example. In particular, nodes x and y when observable (i.e. when the values on x and y directly control or effect the output "OUT") are the same; this can be seen by comparing columns x and y along Row 1 and Row 2 for both Tables A and B. In the cases of Rows 1 and 2 for both Tables, nodes x and y are observable. For Rows 3 and 4, nodes x and y are not observable and this is the only time they differ. Thus, a perfect Boolean match is not required when performing Boolean matching in operation 704.

Selective Filtering

In one embodiment of the present invention, a method of the present invention selectively filters a synthesized circuit to display certain gates and to hide (from display) other gates. Gates that are in a critical logic path may be selected to be hidden if display of these gates is not desired. In one embodiment of the present invention, selective filtering is performed on particular types of gates, such as registers, or carry logic, and so on. In an alternative embodiment, particular gates to be hidden may be selected by specifying a circuit identifier, or by pointing to the gate using a cursor control device. Selective filtering of particular devices causes the display of only non-hidden portions of the circuit.

Programming Implementation

One embodiment of the present invention may be a circuit design and synthesis Computer Aided Design (CAD) program which is implemented as a C program. This program is stored in a computer readable storage medium which may be a CD-ROM or a magnetic hard disk or an optical disk or any of the various alternative storage devices.

The steps of a method of the present invention may be implemented by a central processing unit (CPU) in a computer executing sequences of computer program instructions stored in a memory which may be considered to be this computer readable storage medium. The memory may be a random access memory (RAM), read-only memory (ROM), a persistent store, such as a mass storage device, or any combination of these devices. Execution of the sequences of instructions causes the CPU to perform operations according to the present invention. The instructions may be loaded into the memory of the computer from a storage device (e.g. a CD ROM, which is itself a computer readable storage medium) or from one or more other computer systems over a network connection. The instructions may be stored concurrently in several storage devices (e.g. DRAM and hard disk, as virtual memory). Consequently, execution of the instructions may be performed directly by the CPU. In other cases, the instructions may not be directly executable by the CPU. Under these circumstances, the instructions may be executed by causing the CPU to execute an interpreter that interprets the instructions, or by causing the CPU to execute instructions which convert the received instructions to instructions which can be directly executed by the CPU.

Figure 9:
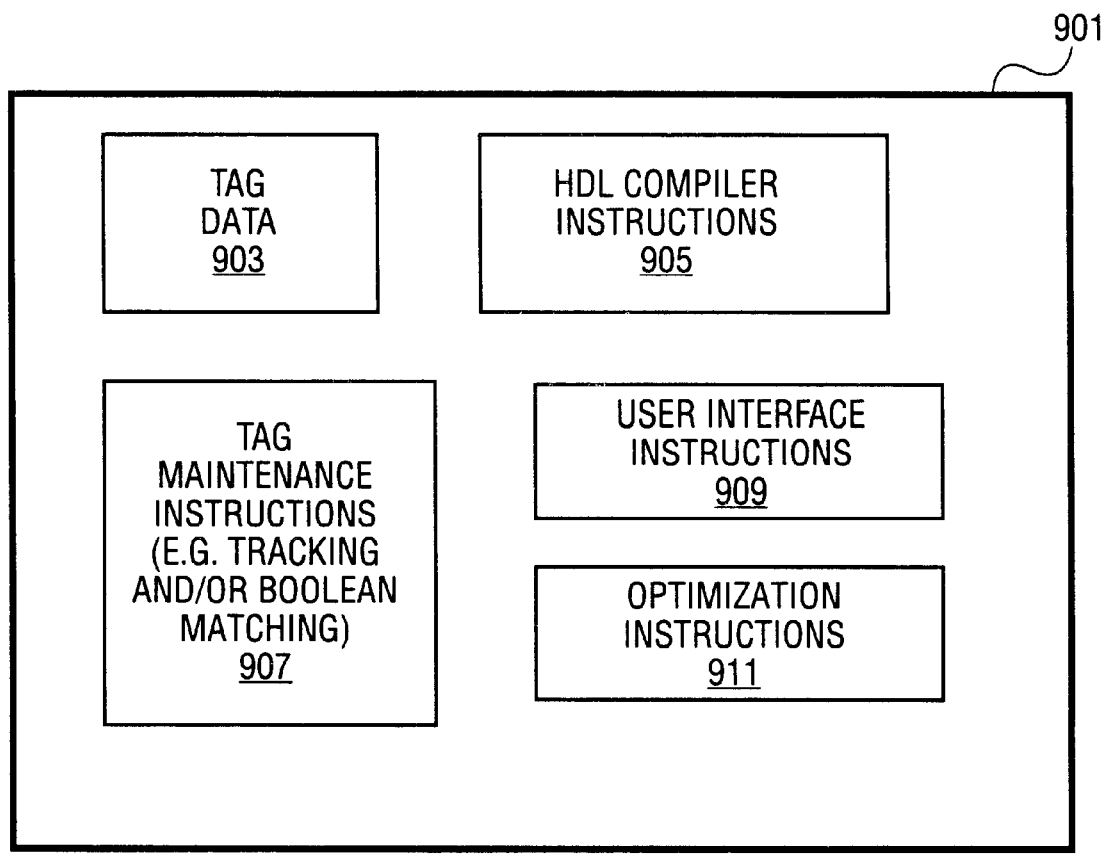
FIG. 9 shows an example, according to the invention, of a computer readable medium which includes executable instructions which, when executed by a digital processing system (e.g. a computer) cause the system to perform an example of a method according to the invention.

The instructions may be stored with (or separately from) the data shown in FIG. 6. The instructions will typically generate and use this data in order to perform the methods of the present invention. FIG. 9 shows one example of a computer readable medium which contains executable computer program instructions which when executed by a digital processing system cause the system to perform at least one example of a method according to the invention. The medium 901 includes optional tag data 903 (which may be stored separately from the instructions); an example of this tag data is shown in FIG. 6. The medium 901 includes HDL compiler instructions 905 which may be used to compile HDL text representations to create RTL netlist representations (which may be stored separately). The medium 901 also includes tag maintenance instructions 907 which may be used to track/preserve the tags or perform Boolean matching to maintain the tags from HDL compilation to RTL netlist and then from original RTL netlist to optimized RTL netlist. Further, the medium 901 includes User Interface instructions 909 which may be used to generate the displays showing (e.g. by highlighting) portions of text or netlist or schematic diagrams being selected and the corresponding portions of another representation of the circuit. The optimization instructions 911 may be used to perform optimizations of a representation of a circuit (e.g. operation 508 of FIG. 5).

In other embodiments, hardwired circuitry may be used in place of, or in combination with, software instructions to implement the present invention. Thus, the present invention is not limited to any specific combination of hardware circuitry and software, nor to any particular source for the instructions executed by the computer.

In the foregoing, a system has been described for preserving correlation between circuit element source code representation and schematic representation during logic synthesis optimization. Although the present invention has been described with reference to specific exemplary embodiments, it will be evident that various modifications and changes may be made to these embodiments without departing from the broader spirit and scope of the invention as set forth in the claims. Accordingly, the specification and drawings are to be regarded in an illustrative rather than a restrictive sense.

What is claimed is:

1. A method for designing logic circuits comprising;
   compiling a test representation of a logic circuit;
   optimizing said logic circuit;
   graphically displaying at least a portion of a circuit representation of said logic circuit after optimizing said logic circuit;
   selecting a portion of said text representation;
   constructing a correlation between said portion of text representation and a portion of a graphic representation after optimizing said logic circuit;
   assigning a first identifier tag to said text representation of said logic circuit,
   assigning a second identifier tag to said graphic representation of said logic circuit, said second identifier tag being linked to said first identifier tag; and
   displaying said portion of said graphic representation which corresponds to said portion of said text representation.

2. The method of claim 1 wherein said text representation is written in a hardware description language and wherein said displaying of said portion of said graphic representation is after said optimizing and wherein said optimizing is for a target integrated circuit architecture.

3. The method of claim 2 further comprising assigning a third identifier tag to said circuit representation of said logic circuit after optimizing said logic circuit, said third identifier tag being linked to said first identifier tag.

4. A method for designing logic circuits comprising:
   describing a first circuit in text representation;
   assigning a first identifier tag to at least a portion of said text representation;
   synthesizing said text representation to produce a first schematic representation of said first circuit;
   assigning a second tag corresponding to said first tag to at least a portion of said first schematic representation of said first circuit;
   optimizing, through a Boolean relationship, said first circuit to produce a second schematic representation of said first circuit;
   constructing a correlation between at least said portion of said text representation and said second schematic representation after optimizing said first circuit; and
   assigning a third tag corresponding to said first tag to at least a portion of said second schematic representation, said third tag being linked to said first tag.

5. The method of claim 4 wherein said text representation is written in a hardware description language.

6. The method of claim 5 wherein said first schematic representation and said second schematic representation comprise register transfer level netlist objects.

7. The method of claim 6 further comprising:

displaying said second schematic representation;

displaying said text representation; and displaying in highlight a portion of said text representation and displaying in highlight a portion of said second schematic representation.

8. A computer readable medium having stored thereon sequences of instruction which are executable by a digital processing system, and which, when executed by the digital processing system, cause the system to preform a method comprising:

compiling a text representation of a logic circuit;

optimizing said logic circuit;

graphically displaying at least a portion of a circuit representation of said logic circuit after optimizing said logic circuit;

selecting a portion of said text representation;

constructing a correlation between said portion of text representation and a portion of a graphic representation after optimizing said logic circuit;

assigning a first identifier tag to said portion of said text representation;

assigning a second identifier tag to said portion of said graphic representation, said second identifier tag being linked to said first identifier tag; and displaying said portion of said graphic representation which corresponds to said portion of said representation.

9. A computer readable medium as in claim 8 wherein said text representation is written in a hardware description language and wherein said displaying of said portion of said graphic representation is after said optimizing and wherein said optimizing is for a target integrated circuit architecture.

10. A computer readable medium as in claim 8 wherein said correlation links said second identifier tag to said first identifier tag and wherein said selecting is performed by a user manipulating a cursor control device to select said portion of said text representation.

11. A computer readable medium as in claim 10 wherein said selecting produces a display of highlighted text, and wherein said displaying of said portion of said graphic representation displays said portion of said graphic representation in a highlighted format.

12. A computer system comprising:

a bus;

a data storage device coupled to said bus; and a processor coupled to said data storage device, said processor operable to receive instruction which, when executed by the processor, cause the processor to perform a method comprising:

complining a text representation of a logic circuit;

optimizing said logic circuit for a target integrated circuit architecture;

graphically displaying a circuit representation of said logic circuit after optimizing said logic circuit;

selecting a portion of said text representation;

constructing a correlation between said portion of text representation and a portion of a graphic representation after optimizing said logic circuit;

assigning a first identifier tag to said portion of said text representation;

assigning a second identifier tag to said portion of said graphic representation, said second identifier tag being linked to said first identifier tag, and displaying said portion of said graphic representation which corresponds to said portion of said text representation.

13. A computer system as in claim 12 wherein said text representation is written in a hardware description language and wherein said displaying of said portion of said graphic representation is after said optimizing.

14. A computer system as in claim 12 wherein said correlation links said second identifier tag to said first identifier tag and wherein said selecting is performed by a user manipulating a cursor control device to select said portion of said text representation.

15. A computer system as in claim 14 wherein said selecting produces a display of highlighted text, and wherein said displaying of said portion of said graphic representation displays said portion of said graphic representation in a highlighted format.

16. A method for designing logic circuits, said method comprising:

compiling a text representation of a logic circuit;

optimizing said logic circuit through a Boolean relationship;

graphically displaying a graphical schematic of at least a portion of a circuit representation of said logic circuit after optimizing said logic circuit;

selecting a portion of said graphical schematic;

constructing a correlation between said portion of said text representation and said portion of said graphical schematic after optimizing said logic circuit;

assigning a first identifier tag to said portion of said text representation;

assigning a second identifier tag to said portion of said text graphical schematic, said second identifier tag being linked to said first identifier tag; and displaying a portion of said text representation which corresponds to said portion of said graphical schematic.

17. A method as in claim 16 wherein said selecting of said portion of said graphical schematic results in said portion being displayed in a first highlighted manner relative to a remainder of said graphical schematic and wherein said portion of said text representation is displayed in a second highlighted manner relative to a remainder of said text representation which is displayed.

18. A method as in claim 17 wherein said text representation is written in a hardware description language.

19. A method as in claim 16 wherein said correlation links said second identifier tag to said first identifier tag and wherein said selecting is performed by a user manipulating a cursor control device to select said portion of said graphical schematic.

20. A computer readable medium having stored thereon a sequence of executable instructions which, when executed on a digital processing system, cause said system to preform a method comprising:

compiling a text representation of a logic circuit;

optimizing said logic circuit through a Boolean relationship;

graphically displaying a graphical schematic of at least a portion of a circuit representation of said logic circuit after optimizing said logic circuit;

selecting a portion of said graphical schematic;

constructing a correlation between said portion of said text representation and said portion of said graphical schematic after optimizing said logic circuit;

assigning a first identifier tag to said portion of said text representation;

assigning a second identifier tag to said portion of said graphical schematic, said second identifier tag being linked to said first identifier tag; and displaying a portion of said text representation which corresponds to said portion of said graphical schematic.

21. A computer readable medium as in claim 20 wherein said selecting of said portion of said graphical schematic results in said portion being displayed in a first highlighted manner relative to a remainder of said graphical schematic and wherein said portion of said text representation is displayed in a second highlighted manner relative to a remainder of said text representation which is displayed.

22. A computer readable medium as in claim 21 wherein said text representation is written in a hardware description language.

23. A computer readable medium as in claim 20 wherein said correlation links said second identifier tag to said first identifier tag and wherein said selecting is performed by a user manipulating a cursor control device to select said portion of said graphical schematic.

24. A method for designing logic circuits, said method comprising:

displaying at least a portion of a text representation of a logic circuit;

selecting a first portion of said at least a portion of said text representation;

constructing a correlation between at least said portion of said text representation and a portion of graphical schematic after optimizing said logic circuit;

assigning a first identifier tag to said portion of said text representation;

assigning a second identifier tag to said graphical schematic, said second identifier tag being linked tag said first identifier tag;

displaying, in response to said selecting, a first portion of said graphical schematic which had been derived from said text representation and them optimized through a Boolean relationship.

25. A method for designing logic circuits, said method comprising:

displaying at least a portion of a graphical schematic of a logic circuit, said graphical schematic having been derived from a text representation of said logic circuit and the optimized through a Boolean relationship;

selecting a first portion of said graphical schematic;

constructing a correlation between said portion of said graphical schematic and said text representation after optimizing said logic circuit;

assigning a first identifier tag to said portion of said graphical schematic;

assigning a second identifier tag to said text representation, said second identifier tag being linked to said first identifier tag;

displaying, in response to said selecting, a portion of said representation from which said first portion of said graphical schematic was derived.

26. A method as in claim 25, said method further comprising:

selecting for display a portion of said graphical schematic which is in a critical path of said logic circuit.

27. A method as in claim 26 wherein said selecting specifies a particular type of logic gate for display such that a filtered graphical schematic of only said particular type of logic gates is displayed.

28. A method as in claim 26 wherein said selecting is performed by a user manipulating a cursor control device to select said portion.

29. A computer readable medium having stored thereon executable computer program instructions which, when executed by a digital processing system, cause said system to perform a method for designing logic circuits, said method comprising:

generating a first representation of a logic circuit;

performing an optimization of said logic circuit to create a second representation which represents a transformation of said first representation, said optimization being performed through a Boolean relationship;

assigning a first identifier tag to said first representation;

assigning a second identifier tag to said second representation, said second identifier tag being linked to said first identifier tag; and correlating a first set of intermediate nodes in said first representation to a second set of intermediate nodes in said second representation, wherein said correlating creates a set of matched tags for said first and said sescond sets of intermediate nodes after performing said optimization of said logic circuit.

30. A computer readable medium as in claim 29 wherein said first representation is an RTL netlist or a schematic representation.

31. A computer readable medium as in claim 29 wherein said second representation is an RTL netlist or a schematic representation.

\* \* \* \* \*